(12) United States Patent
Slawecki et al.

(10) Patent No.: US 6,883,127 B2
(45) Date of Patent: Apr. 19, 2005

(54) COMPARISON CIRCUIT AND METHOD FOR VERIFICATION OF SCAN DATA

(75) Inventors: Darren Slawecki, Santa Clara, CA (US); Stephan Rotter, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 453 days.

(21) Appl. No.: 09/895,589

(22) Filed: Jun. 28, 2001

(65) Prior Publication Data

US 2003/0005379 A1 Jan. 2, 2003

(51) Int. Cl.7 .............................................. G01R 31/28
(52) U.S. Cl. ...................... 714/726; 714/731; 714/732
(58) Field of Search .......................... 714/30, 731, 733, 714/732, 726, 734, 718, 719, 744, 798, 724; 713/500, 600

(56) References Cited

U.S. PATENT DOCUMENTS

| | | | | |
|---|---|---|---|---|
| 4,594,711 A | * | 6/1986 | Thatte ........................ | 714/728 |
| 5,912,901 A | * | 6/1999 | Adams et al. ............... | 714/733 |
| 5,930,270 A | * | 7/1999 | Forlenza et al. ............ | 714/736 |
| 6,346,822 B1 | * | 2/2002 | Nishikawa ................... | 326/16 |
| 6,560,740 B1 | * | 5/2003 | Zuraski et al. .............. | 714/733 |

* cited by examiner

Primary Examiner—Christine T. Tu
(74) Attorney, Agent, or Firm—Blakely, Sokoloff, Taylor & Zafman LLP (57) ABSTRACT

An apparatus and a method are disclosed to save on the integrated circuit die(s) the state of the scan latches coupled to an integrated circuit in a memory unit during an exercise of the integrated circuit by a coupled tester, to compare on the die the saved states to the state of the scan latches in a subsequent exercise of the integrated circuit, and to transmit the result of the comparison to the tester, rather to have to transmit to the tester the scan latch states for a comparison analysis after each exercise of the integrated circuit. The apparatus and method include deriving on the die a signature of the saved scan latch states, and comparing on the die the signature of an exercise of the integrated circuit and subsequently exercise of the integrated circuit. The invention also includes generating on the die a scan latch latching clock for consecutively exercising the integrated circuit without determining off the die, and sending to the die, for each iteration, the latching clock.

30 Claims, 5 Drawing Sheets

COMPARISON CIRCUIT AND METHOD FOR VERIFICATION OF SCAN DATA

TECHNICAL FIELD

This disclosure relates generally to integrated circuit testing, and particularly but not exclusively relates to a built-in test circuit for comparing a passing scan and a failing scan, and for selecting the clock pulse at which to latch a scan chain.

BACKGROUND

An integrated circuit is functionally tested to ascertain the performance of the circuit at specified conditions, and to isolate any faults in the circuit at the specified conditions. The specified conditions may include core clock pulse frequency, signal level voltage, and ambient temperature. A test system for the functional test generally includes the circuit-under-test coupled to a tester that is itself coupled to a computing device workstation.

In operation, the tester generates an at least one test-data sequence of pulses, and an at least one clock signal sequence of pulses, that are each sent to at least one port of the circuit-under-test die(s). Generally, the clock signal generated by the tester is at a lower frequency than the functional speed of the circuit-under-test, so the circuit-under-test die(s) includes a coupled frequency boosting circuit to receive the tester generated clock signal, raise the frequency of the pulses of the tester generated clock signal, and output a higher frequency clock signal to the circuit-under-test as the core clock.

In operation, the circuit-under-test generates at least one functional output pulse in response to receiving the test data input and the core clock, that is sent to at least one port of the circuit-under-test die and received by the tester. The circuit-under-test die(s) generally also includes an at least one scan latch test circuit coupled to the circuit-under-test to save at least one signal state of the circuit-under-test that is not normally observable in a functional output pulse. At a specified time, in response to a scan clock signal, the scan latches collectively generate a pulse train, each pulse of the pulse train representing a signal state saved in a scan latch, to an at least one port of the circuit-under-test die(s), and received by the tester.

Conventionally, the tester sends to the workstation the data received from the circuit-under-test. The workstation executes programs to analyze the data received from the tester, and to determine if the expected functional outputs from the circuit-under-test conform with expected values for each tester clock pulse of interest, and if the scan latch pulse train (or its signature) output conforms to the expected values, for each core clock pulse of interest.

Furthermore, conventionally the workstation defines and sends to the tester an identification of each clock at which to latch the scan latches, for each new test of the integrated circuit-under-test, in a header preceding the clock signal or the data input to the integrated circuit die. Each new test, even if the clock signal and the data remains the same, the header must be sent to the circuit-under-test only because a new scan latch clock must be transmitted to the circuit test die for initialization of built in test circuitry on the die(s).

What is needed is an apparatus and a method to compare the result of a test input with a passing or failing test exemplar result on the die and not to transmit for each iteration of the test the test data to the tester-workstation combination and analyze for each iteration of the test the data on the tester-workstation combination. What is needed is an apparatus and a method to change the scan latch timing of the clock signal automatically on the integrated circuit die(s) and not to generate the clock signal for each iteration of the test from the tester-workstation combination, and not to transmit for each iteration of the test the clock signal for each iteration.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. The order of description should not be construed as to imply that these operations are necessarily order dependent.

DETAILED DESCRIPTION

Embodiments of an apparatus and method for comparing the internal states of an integrated circuit under test, and automatically generating a scan latch clock for scan latches (or other storage elements) coupled to the integrated circuit under test, by on-die test circuitry are described herein. In the following description, numerous specific details are provided thoroughly understanding the embodiments of the present invention. One skilled in the relevant art will recognize, however, that the invention can be practiced without one or more of the specific details, or with other steps, methods, systems, components, materials, etc. In other instances, well-known structures, materials, system components, or steps of methods are not shown, or if shown are not described in detail, to avoid obscuring aspects of the invention.

Reference throughout this specification to "one embodiment" or "an embodiment" means that a particular feature, structure, step, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, steps, or characteristics may be combined in any suitable manner in one or more embodiments.

Various operations will be described as multiple discrete steps performed in turn in a manner that is most helpful in understanding the present invention. However, the order of description should not be construed as to imply that these operations are necessarily order dependent, in particular, the order the steps are presented. Any necessary ordering is alternatively expressly mentioned or will be understood by those skilled in the art.

As used herein, a scan latch comprises a clocked memory element such as a latch to hold the binary output data from a coupled portion of a circuit under test. And as used herein, a circuit comprises an interconnection of electrical elements to form an at least one path for the flow of electrical current.

Figure 1:
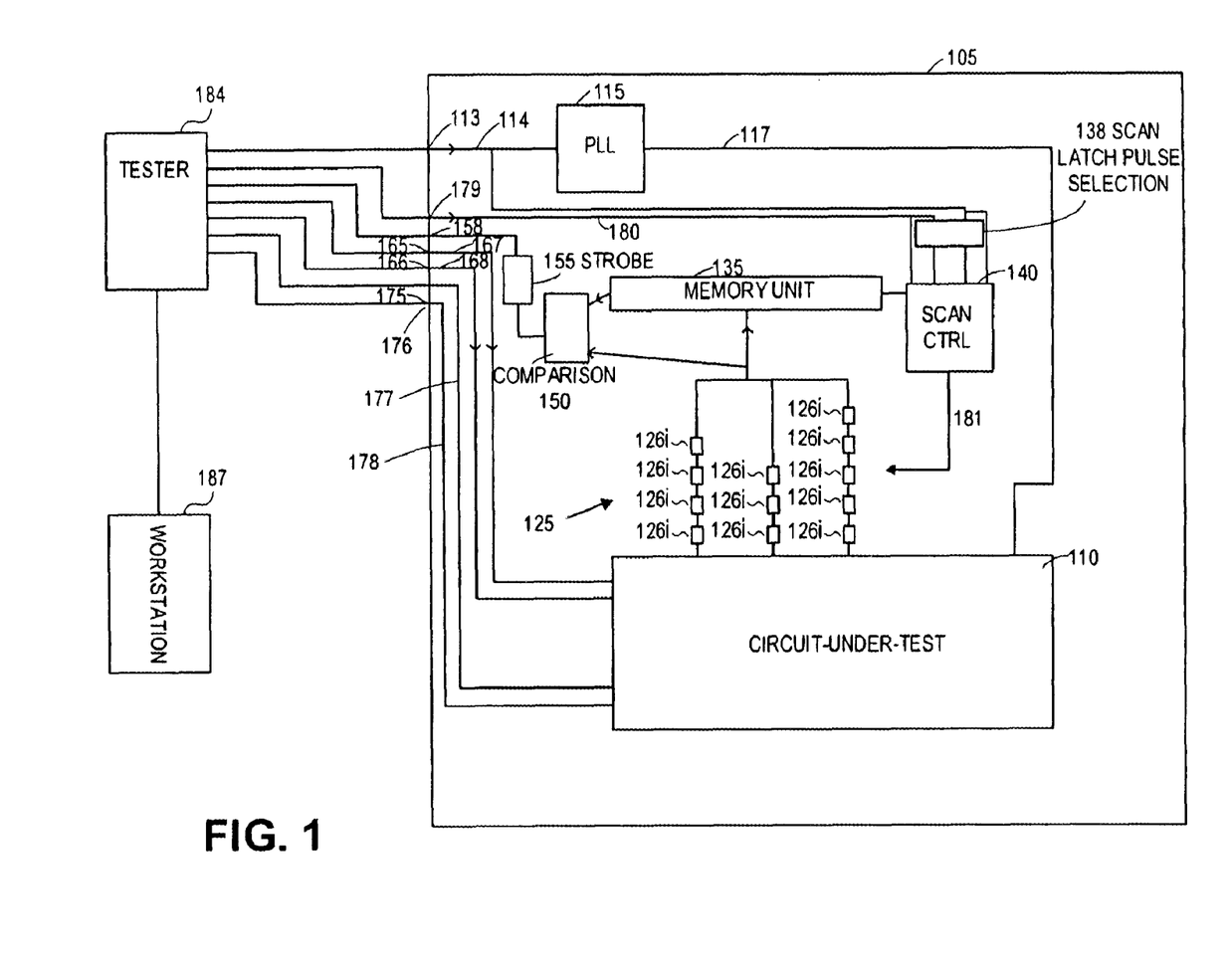
FIG. 1 portrays an embodiment of a functional block diagram of a test system to test an integrated circuit that includes a die having the circuit-under-test and a built-in-test circuitry, a tester; and a workstation computing device for deriving, storing, and analyzing latched circuit states.

Referring now to FIG. 1, an integrated circuit on at least one die and coupled terminals 105 includes a circuit-under-test 110, and support and built-in test circuitry to be presently described.

A terminal (or port) 113 is coupled to a tester 184 to conventionally receive clock signal sequence of pulses from the tester 184. The clock signal from the tester 184 is transmitted along a signal path 114 to a coupled Phase Locked Loop (PLL) circuit 115, or other circuit well know to those skilled in the art to at least raise the frequency of the clock signal from the tester 184 to a preferred clock frequency, and/or assure a synchronized even duty cycle clock. The output of the PLL circuit 115 is a stable clock signal sequence of pulses at the preferred frequency for the circuit-under-test 110, that passes through the coupled signal path 117, to the circuit-under-test 110, as the core clock signal for the circuit-under-test 110. Testing occurs at two different conditions.

A data input from the tester 184 includes a header of information that is transmitted to the scan control circuit 140. The header information includes data to indicate the clock at which the built-in-test circuit is to latch (or capture) the scan latches 126i. The header may be in the tester clock signal sequence of pulses input to the die(s) 105 on the terminal 113 as described above, and in at least one of the data inputs described below with reference to the terminals 165 and 166. It is within the specific contemplation of the present invention that the header information may be transmitted to the die 105 with another signal or by a different port than is described herein, as is well known to those skilled in the art. The header includes data to indicate the core time of a pulse at which the built-in-test circuit is to latch (or capture) the scan latches 126i. The header information is transmitted illustratively along the signal path 114 to a scan control circuit 140. However, in the embodiment presented herein, a trigger signal is conventionally transmitted as well from the tester 184, to the die at a coupled illustrative terminal (or port) 179 to provide a tester clock reference for the core clock identified in the header. It is within the specific contemplation of the present invention that the trigger may be transmitted in another signal or along a different terminal as described herein as is well known to those skilled in the art. In an alternate embodiment, the trigger is specified or generated internally by an event or a sequence of events or state(s) inside the integrated circuit.

In operation, the tester 184 transmits to the terminal 179 the trigger signal, and the scan control circuit 140 latches the scan latches 126i by providing a scan clock pulse signal to each scan latch 126i along the circuit path 181. The scan clock pulse signal is provided to each scan latch 126i at the time of the clock pulse identified in the header after the trigger signal. The circuit-under-test 110 is coupled to built-in test circuitry that includes an at least one scan chain 125, each scan chain having coupled individual scan latches 126i or other memory elements that are each coupled (not shown) to a separate portion of the circuit-under-test 110, as is well known to those skilled in the art. Each scan latch 126i is to save a signal state of a coupled portion of the circuit-under-test 110 in response to a latch command from the scan control circuit 140 through the path 181, discussed with reference to the trigger signal above. Here, the latch command through the path 181 refers to multiple control signals to all the scan latches 126i because typically both clocks and commands are sent to each scan latch 126i to control its operation.

The dies 105 includes a memory unit 135. Under the control of the scan control circuit 140, the scan chains 125 unload the state of the scan latches 126i to the memory unit 135, and the memory unit 135 stores the state of each transferred scan latch 126i as a corresponding high or low valued bit. The content of each bit of the memory unit 135 is unloaded to the comparison circuit 150 in synchronization with the unload of the scan chains 125 to the comparison circuit 150 as described presently. It is within the specific contemplation of the present invention that the memory unit 135 is distributed on the die(s), such as distributed to each of the scan latches 126i where each scan latch 126i is capable if storing the first condition, as well as the second condition.

Under the control of the scan control circuit 140, the scan chains 125 unload the state of each scan latch 126i to the comparison circuit 150, in synchronization with the unload of the memory unit 135 to the comparison circuit 150, such that each bit of the scan latch state stored by the memory unit 135 is compared to a state of the same scan latch unloaded to the comparison circuit 150. The output of the comparison circuit is a string of pulses, each pulse representing the result of the comparison of the state of a scan latch stored in the memory unit 135 with the state of the same scan latch unloaded from the scan chain 125 to the comparison circuit 150. Preferably, the comparison circuit 150 performs an exclusive-or operation, or some other operation that will result in a single bit whose value indicates whether or not the two compared bits are of the same value or are not of the same value, such that the output of the comparison circuit 150 is a string of pulses each representing an exclusive-or operation such that the low-valued pulses mean that the compared scan latch values are the same, and the high-valued pulses mean that the compared scan latch values are not the same. Therefore, a high-valued pulse in the output of the comparison circuit 150 means that the stored and the directly unloaded scan latch states do not correspond. In an alternate embodiment, the low-valued pulses mean that the compared scan latch values are not the same and high-valued pulses mean the compared scan latch values are the same.

In operation of the present invention, the circuit-under-test 110 exercises the circuit-under-test under a condition to operate properly and generate a "passing result" set of scan latch 126i states. Such a condition may be a core clock signal frequency adequately slow to result in a proper operation of the circuit-under-test. The passing result scan latches 126i are unloaded to the memory unit 135 so that the memory unit 135 thus stores a scan latch state passing result.

Subsequently, the circuit-under-test 110 is operated at a second condition that may (or may not) result in an improper operation, such as illustratively a core pulse signal higher frequency or an at least one pulse of the core clock signal having a higher frequency. The scan latches 126i containing the second condition results are unloaded to the comparison circuit 150 in synchronization with the stored content in the memory unit 135 for a comparison with the second condition result with the stored passing result in the memory unit 135. Alternatively in another usage model, the memory unit 135 may store a suspected failing test that is then compared to a known passing result.

The output of the comparison circuit is passed to a terminal (or port) 158 that is conventionally implemented as a connection pin, and transmitted to the tester 184 coupled to the terminal 158, so that the tester has only to scan the output of the comparison circuit 150 for the presence of at least one high value bit to indicate a failing result (for the embodiment of an exclusive-or operation comparison circuit 150), without the comparison circuit 150 output, the tester 184 would otherwise have to download from the integrated circuit die(s) 105 a passing result from the tester 184, transmit the passing result to a workstation 187, download a suspected failing result from the integrated circuit die(s) 105, transmit the suspected passing result to the workstation 187, the workstation 187 would have to perform a comparison of the passing result and suspected failing result to check for any mismatching bits.

Preferably, the built-in test circuit includes a circuit 155 referred to herein as a strobe circuit, to scan the pulse train that is output from the comparison circuit 150 and, in the example of an exclusive-or operation comparison circuit 150, upon identifying a high value pulse in the example of an exclusive-or comparison circuit 150, change all subsequent pulse values to high value pulses. The strobe circuit 155 is coupled to receive the output of the comparison circuit 150 (rather than to be sent to the port 158), and to transmit an output to the port 158. The output of the strobe circuit 155 in the case of the illustrative comparison circuit 150 exclusive-or operation embodiment is low value pulses until the first (if any) failing comparison, and thereafter high value pulses for the remainder of a comparison circuit 150 output. Therefore, the tester 184 receiving the output of the strobe circuit 155 rather than the output of the comparison circuit 150, need only test on the last bit of the pulse train output on the terminal 158 for the presence of a high valued pulse to detect a failing result, rather than scan and test each pulse of the comparison circuit 150 output signal.

Preferably, the built-in-test circuit includes a scan latch pulse selection circuit 138 to automatically change the timing of the scan clock latching signal relative to the core clock signal for each of a plurality of sequential tests from an initial core clock pulse defined by the workstation-tester 184–187 combination. It is specifically within the contemplation of the present invention that the initial core clock pulse location in an embodiment is also determined by selection circuitry within the die(s). Automatically herein means that the selection (or determination) of the scan latch pulse is selected (or determined) within the die and does not require a transmission from outside the die(s), such as from the workstation-tester 184–187 combination. The initial core clock pulse location has been illustratively described above as being determined by both a trigger signal and a core clock data in a header from the tester 184. The scan latch pulse selection circuit 138 eliminates the need to derive and to transmit an identity of the scan clock pulse signal from the tester-workstation 184–187 combination in a header block for each time a test is executed after the initial header transmission. The scan latch pulse selection circuit 138 algorithmically selects the scan clock pulse for each test. In the preferred embodiment, the scan latch pulse selection circuit 138 auto-increments the initial scan clock pulse as will be described with reference to FIG. 3. In an embodiment described with reference to FIGS. 5 and 6 below, the header also includes a target pulse or number of generated pulses, as well as an initial pulse.

The circuit-under-test 110 is coupled to an illustrative two data input terminals (or ports) 165 and 166 to couple to the tester 184. The tester 184 is to provide to the terminals 165 and 166 illustratively two input test data sequence of pulses that are transmitted respectively along the paths 167 and 168 to the circuit-under-test 110 as input data signals to the circuit-under-test 110. The circuit-under-test 110 is further coupled to an illustrative two data output terminals (or ports) 175 and 176 to couple to the tester 184 to provide illustratively two output pulse signals to the tester that are transmitted respectively along the path 177 and 178.

Figure 2:
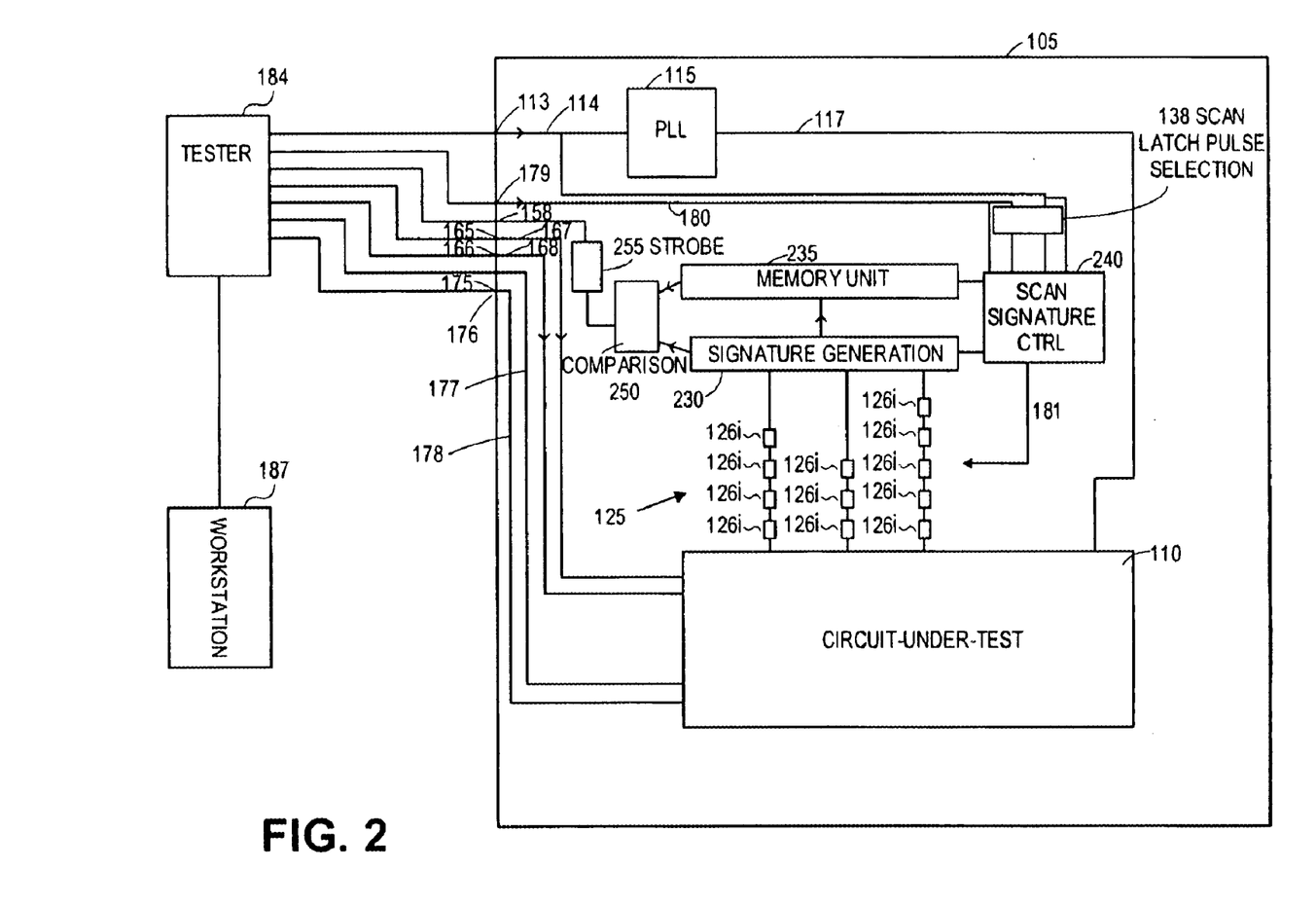
FIG. 2 portrays an embodiment of a functional block diagram of a test system to test an integrated circuit that includes a die having the circuit-under-test and a built-in-test circuitry, a tester; and a workstation computing device for deriving, storing, and analyzing a signature of latched circuit states.

Referring now to FIG. 2, an integrated circuit die and coupled terminals 205 embodiment includes the circuit-under-test 110, the PLL circuit 115, the scan latch pulse selection circuit 138, the scan chain(s) 125, and the scan latches 126i described with reference to FIG. 1. The die 205 includes a signature generation circuit 230 to which the scan chains 125 unload the state of the scan latches 126i in response to a signal from the scan-signature control circuit 240. The signature generation circuit 230 algorithmically transforms the state of scan latches 126i received by the circuit 230 to a statistic of the state of the scan latches as is well known to those skilled in the art. The signature generation circuit 230 transfers the signature of the state of the scan latches 126i to a memory unit 235, and the signature memory unit 235 stores the transferred signature. Under the control of the scan-signature control circuit 240, the content of each bit of the signature stored in the memory unit 235 is unloaded to the signature comparison circuit 250 in synchronization with the unload of the signature generation circuit to the signature comparison circuit 250 as described presently.

Under the control of the scan-signature control circuit 240, the signature generation circuit 230 unloads a signature to the signature comparison circuit 250, and the signature stored in signature memory unit 235 is compared to the signature unloaded directly from the signature generation circuit 230 to detect whether the two signatures are identical. Preferably, that each bit of the signature stored by the signature memory unit 235 is compared to a respective bit of the signature unloaded directly from the signature generation circuit 230. The output of the signature comparison circuit 250 is a string of pulses representing the result of the comparison of the signature stored in the memory unit 235 and the signature of a scan latch state from the signature generation circuit 230. Preferably, the signature comparison circuit 250 performs an exclusive-or operation, some other operation that will result in a single bit whose value indicates whether or not the two compared bits are of the same value or are not of the same value. For the exclusive-or operation, the output of the signature comparison circuit 250 is a string of pulses each representing an exclusive-or operation such that the low-valued pulses mean that the compared bits of the signatures are the same, and the high-valued pulses mean that the compared bits of the signatures are not the same. Therefore, a high valued pulse in the output of the signature comparison circuit 250 means that the stored and the directly unloaded signatures do not correspond.

In operation of the present invention, the circuit-under-test 110 exercises the circuit-under-test under a condition to operate properly and generate a "passing result signature" that is unloaded to the signature memory unit 235. Such a condition may be a core clock signal frequency adequately slow to result in a proper operation. Subsequently, the circuit-under-test 110 is operated at a second condition that may (or may not) result in an improper operation, such as illustratively a core pulse signal higher frequency or an at least one pulse of the core clock signal having a higher frequency. The scan latches 126i containing the second condition results are unloaded to the signature generation circuit 230 to produce a signature of the scan latch states, and the signature generation circuit 230 is unloaded to the signature comparison circuit 250 in synchronization with the stored signature in the memory unit 235 for a comparison of the second condition result with the stored passing result in the memory unit 235. Alternatively in another usage model, the memory unit 235 may store a suspected failing test that is then compared to a known passing result.

The built-in-test circuitry of the die 205 preferably includes a strobe circuit 255 to scan the pulse train that is output from the comparison circuit 250 and, upon identifying a high value pulse in the example of an exclusive-or comparison circuit 250, change all subsequent pulse values to high value pulses. The strobe circuit 255 is coupled to receive the output of the comparison circuit 250 (rather than to be sent to the port 158), and to transmit an output to the port 158. The output of the strobe circuit 255 in the case of the illustrative comparison circuit 250 exclusive-or operation embodiment is low value pulses until the first (if any) failing comparison, and thereafter high value pulses for the remainder of a comparison circuit 250 output. Therefore, the tester 184 receiving the output of the strobe circuit 255 rather than the output of the comparison circuit 250, need only test on the last bit of the pulse train output on the terminal 158 for the presence of a high valued pulse to detect a failing result, rather than scan and test each pulse of the comparison circuit 250 output signal.

The conversion of the scan latch state to a signature is preferred because the signature will be represented by fewer bits than the number of scan latches 126i, for a signal generation circuit performing a compression algorithm and thus will reduce the amount of built-in-test circuitry on the die 205 to store the scan latch states, and the transmission time to transmit the result of the comparison to the tester/workstation 184/187.

Figure 3:
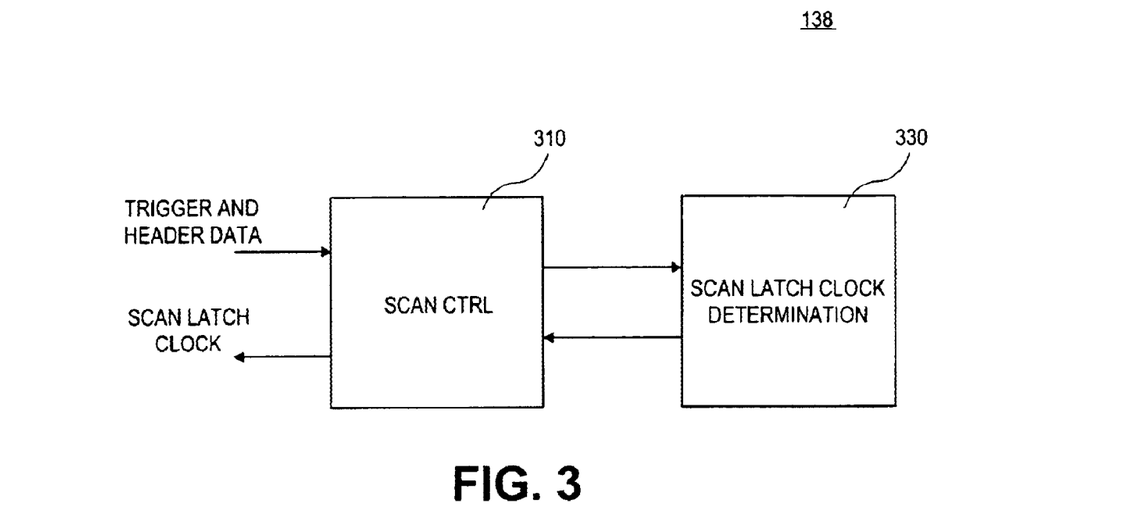
FIG. 3 portrays an embodiment of a scan latch pulse selection circuit.

Referring now to FIG. 3, a scan latch pulse selection circuit 138 intercepts the external trigger and delays the trigger to the built-in-test circuitry scan control circuit 140/240. The scan latch pulse selection circuit 138 includes a scan control circuit 310 to receive signals from outside the scan latch pulse selection circuit 138 and to transmit signals to a scan latch clock determination circuit 330 portrayed herein and in FIG. 4. In an embodiment the scan control circuit 310 receives an external trigger data indicating a selected initial clock for latching the scan latches, and header data from the tester 184 that includes both the initial scan latch clock displacement from the trigger and the target scan latch clock for the last scan latch clock to scan latches 126i. The scan control circuit 310 in response transmits an initial latch clock setting and a target latch clock setting to the pulse determination circuit 330. The scan control circuit 310 receives an internal trigger from the scan latch clock determination circuit 330; and in response transmits a delayed scan latch clock indication signal to the scan control circuit 140/240.

Figure 4:
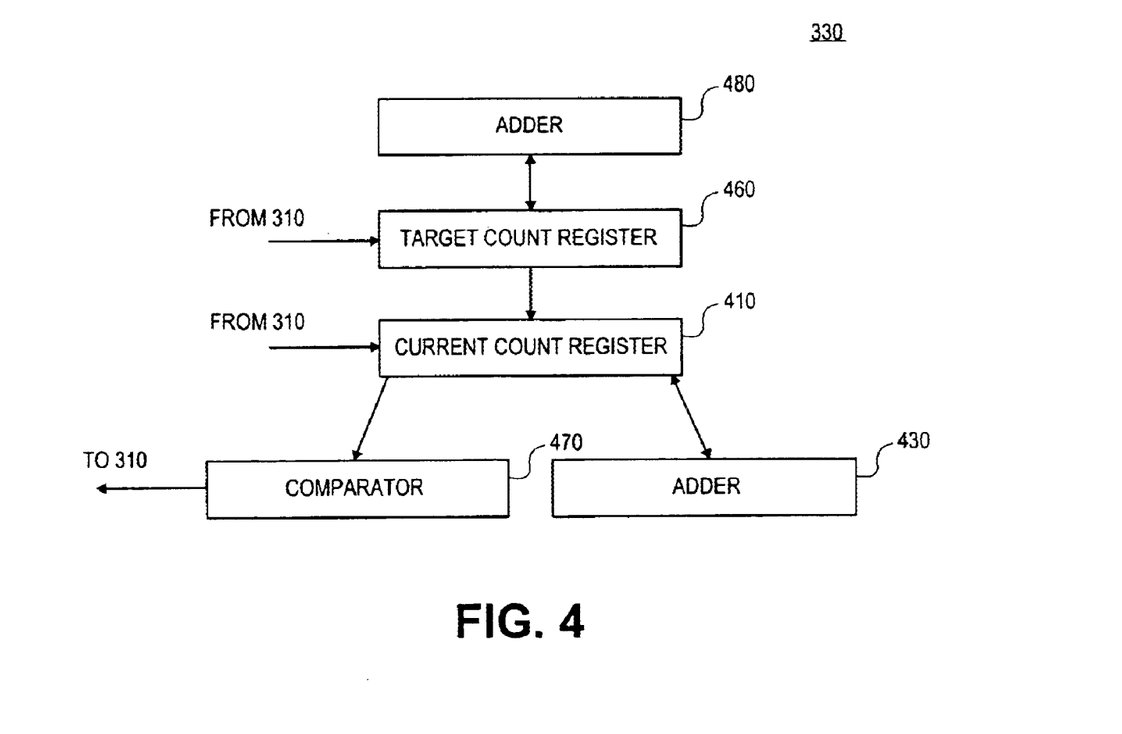
FIG. 4 portrays an embodiment of a pulse determination circuit of a scan latch pulse selection circuit.

Referring now to FIG. 4, a preferred embodiment of a pulse determination circuit 330 is implemented as an auto-increment circuit in order to increase the determined scan latch pulse by a value of 1 each test iteration. The pulse determination circuit 330 includes a target count register 460 to receive upon reset the initial clock setting signal from the scan control circuit 310 (FIG. 3). The pulse determination circuit 330 includes an adder circuit 430 preferably implemented as a down-counter, coupled to the current counter register 410 to decrement the current count register 410 by 1 after each core clock after the trigger signal. The pulse determination circuit 330 includes a target count register 460 to receive the target setting from the scan control circuit 310 (FIG. 3). The pulse determination circuit 330 includes an adder circuit 480 preferably implemented as an up-counter, coupled to the target count register 460 to increment the target count register 460 by 1 after each scan latch load to realize an incrementing of the scan count by 1. The comparator circuit 470 is coupled to the current count register 410 to compare the content of the current count register 410 to zero, and signal a match when the current count has attained a zero value, and otherwise to issue the internal trigger to the scan control circuit 310 (FIG. 3). The target count register 460 additionally includes an optional output to the scan latches 125 to output to the tester 184 through the scan latches 125 to enable observability by the tester/workstation of the scan latch clock.

It will be clear to those skilled in the art that a different circuit of the pulse determination circuit can be implemented to realize this algorithm or a different algorithm, such as an algorithm for decrementing down or incrementing up by any number of clocks, and that the present invention is not limited to the algorithm described herein. It will also be clear to those skilled in the art that a target condition is a quantifiable condition that in embodiments includes a specific clock identifier, a number of iterations, and the like. The present invention also specifically includes generating the initial clock from a default condition and/or generating a target condition from a default condition, in which a coupled external circuit such as the tester 184 does not supply an initial clock and/or a target condition.

Figure 5:
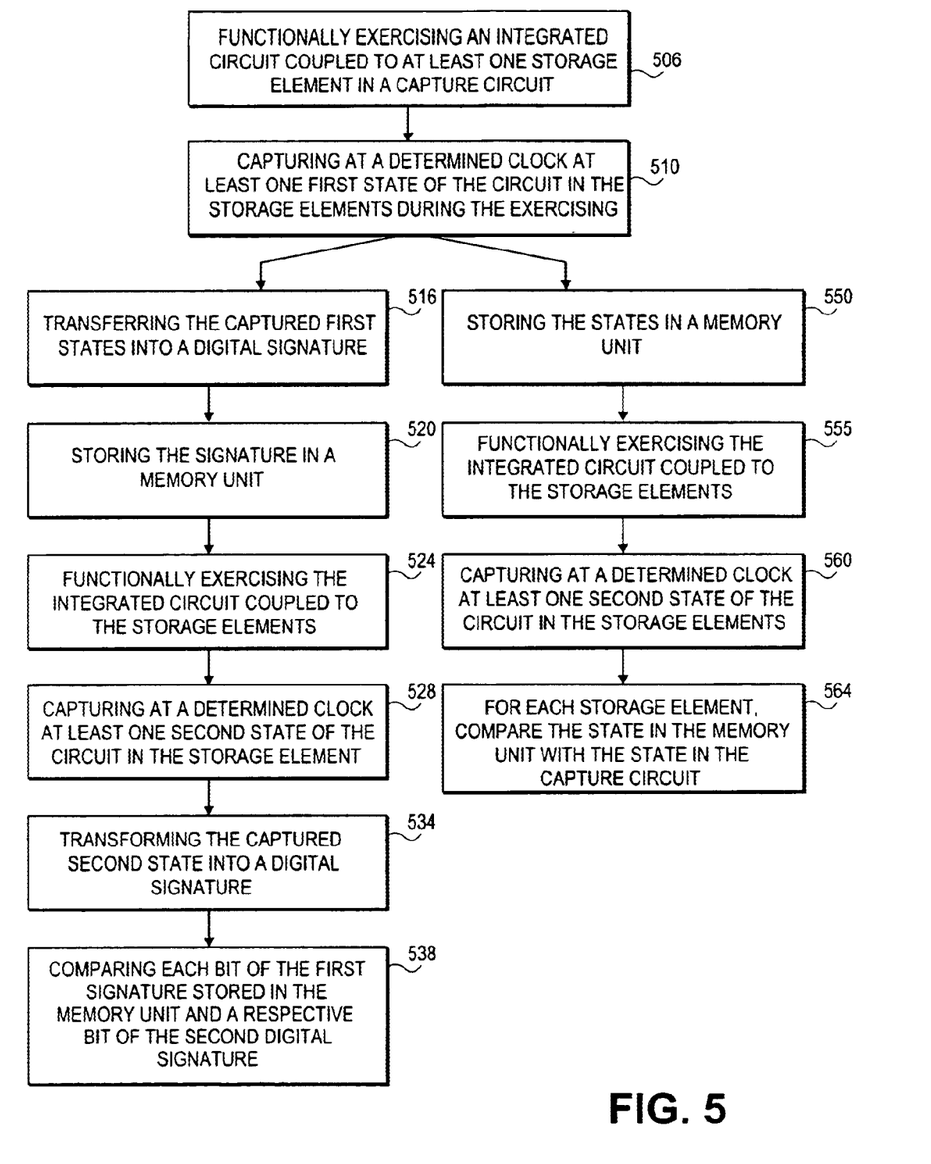
FIG. 5 is a flow chart of an embodiment of a method to compare on a die a scan latch unload or a signature of the unload with respectively a previous unload and a previous signature. The order of description should not be construed as to imply that these operations are necessarily order dependent.

Referring now to FIG. 5, a method includes in block 506 an integrated circuit that is disposed on at least one die is coupled to at least one storage element in a capture circuit, such with at least one scan latch with at least one scan chain, and the integrated circuit is to be functionally exercised. In an embodiment, the integrated circuit is to be functionally exercised by receiving functional data inputs at a port of the die, and by receiving a clocking signal from a port of the die, from a coupled tester. It is expected that the clocking signal will be converted into a higher frequency pulse signal and/or be cleaned and synchronized as described with reference to FIGS. 1 and 2.

In block 510, the storage elements are to capture at a determined clock at least a first state of the integrated circuit in the storage elements during the functional exercising of the integrated circuit described with reference to block 506. Each storage element, such as a scan latch, is to capture a signal state of a coupled portion of the circuit, as described with reference to FIGS. 1 and 2.

In blocks 516–538, a method is described of comparing on the die a signature of the captured integrated circuit states after the capturing described with reference to block 510. In blocks 550–564, a method is described of comparing on the die the captured integrated circuit states after the capturing described with reference to block 510.

Now, in block 516 for a method of comparing on the die a signature of the captured circuit states, the captured first states are to be transformed into a digital signature of the first states. In block 520 the digital signature derived in block 516 is to be stored in a storage unit. In block 524, the integrated circuit is to be functionally exercised again, and in block 528 the storage elements are to once again capture at a determined clock at least a second state of the integrated circuit during the functional exercising of the integrated circuit described in block 524.

In block 534 the captured second state of the integrated circuit is to be transformed into a digital signature. The term "second" state is used herein to distinguish the captured data from the "first" state captured with reference to block 510. The data captured in the "second" state is for the same circuit portions as captured with reference to block 510, but the data to be captured after the circuit has been exercised a second time. In block 538, each bit of the first signature to be stored in the memory unit is to be compared to a respective bit of the second digital signature, so that the response of the integrated circuit from the first exercising is to be compared to the response of the integrated circuit to the second exercising. Here, even though the embodiment includes a comparison on a bit for bit basis, any other method of comparing the two signatures in order to determines whether the two signatures are or are not the same is specifically within the contemplation of the present invention.

Now in block 550, the states to be captured with reference to block 510 are to be stored in a memory unit. In block 555 the integrated circuit is to be once again functionally exercised, and in block 560 at a determined clock, an at least one second state is to be captured in the storage elements. As described with reference to blocks 516–538, the term "second" state is used herein to distinguish the captured data from the "first" state, wherein the second state is for the same circuit portions but the data is captured after the circuit has been exercised a second time. In block 564, for each storage element, the state in the memory is to be compared with the state in the capture circuit. Because each storage element stores a binary value, the comparison is to be on a bit for bit basis.

In an embodiment the results of the comparing in both blocks 538 and 564 are to be provided to an output port of the die, so that a coupled tester can receive the comparison result. It is preferred that the comparing includes an exclusive-or operation as described with reference to FIG. 1, or some other operation that will result in one or more bits whose value indicates whether or not the two compared bits are of the same value or are not of the same value. The method furthermore preferably includes automatically changing the clock capture signal to the storage elements based on an algorithm, at a time after capturing the second state, wherein a second iteration of the method defined herein in blocks 506–564 includes as the determined clock the automatically changed clock.

Figure 6:
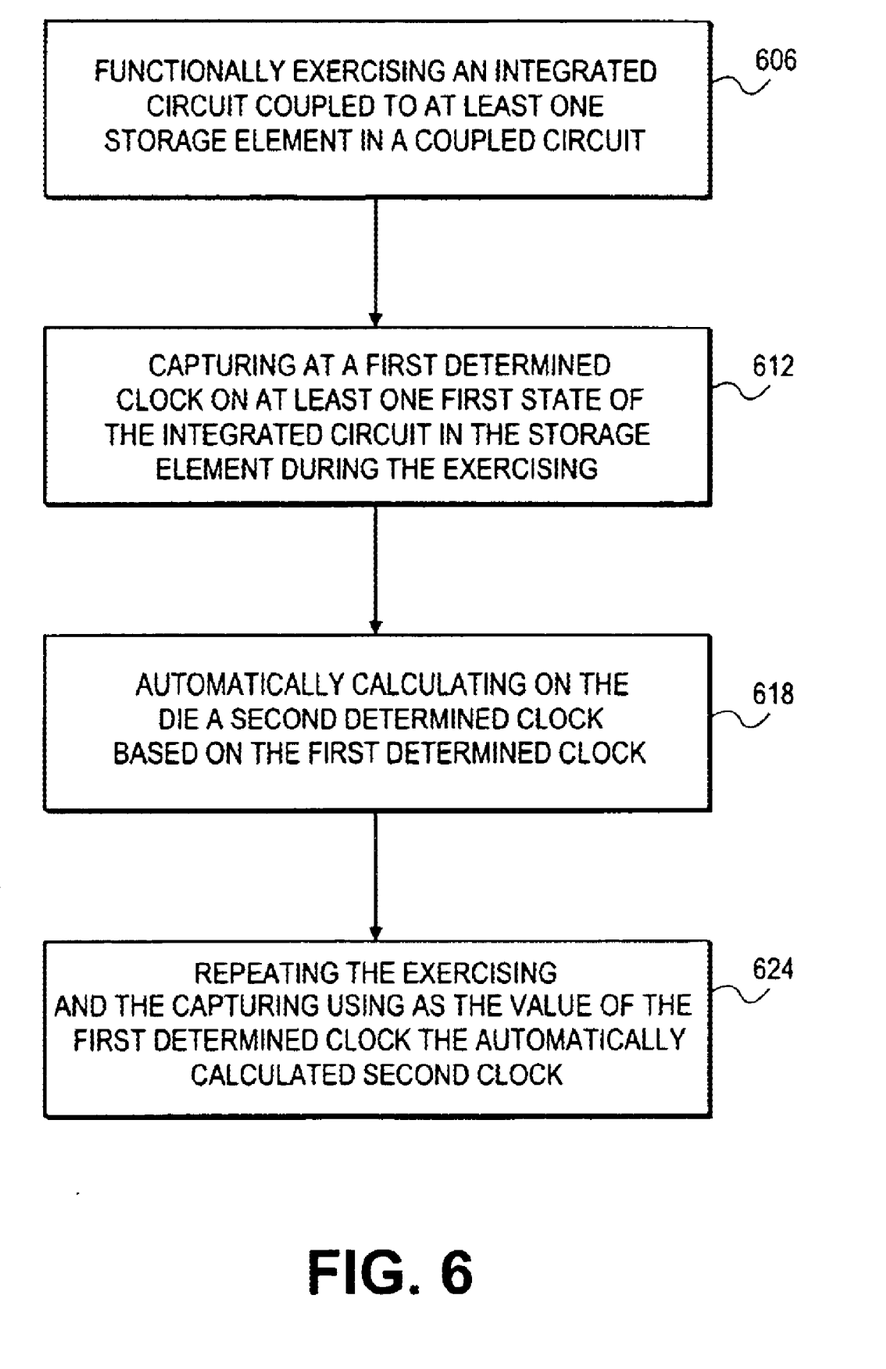
FIG. 6 is a flow chart of an embodiment of a method to automatically change the time to clock the scan latches coupled to a circuit under test for latching the state of the circuit under test. The order of description should not be construed as to imply that these operations are necessarily order dependent.

Now with reference to FIG. 6, a step of the method described with reference to FIG. 5 of automatically changing the clock capture signal of the storage elements is described independently. The method includes in block 606, an integrated circuit that is disposed on at least one die is coupled to at least one storage element in a capture circuit disposed on the die, such with at least one scan latch with at least one scan chain, and the integrated circuit is to be functionally exercised. In an embodiment, the integrated circuit is to be functionally exercised by receiving functional data inputs at a port of the die, and by receiving a clocking signal from a port of the die, from a coupled tester. It is expected that the clocking signal will be converted into a higher frequency pulse signal and/or be cleaned and synchronized as described with reference to FIGS. 1 and 2.

In block 612, the storage elements are to capture at a determined first clock at least a state of the integrated circuit in the storage elements during the functional exercising of the integrated circuit described with reference to block 606. Each storage element, such as a scan latch, is to capture a signal state of a coupled portion of the circuit, as described with reference to FIGS. 1 and 2.

In block 618, a determined second clock at which to capture at least a state of the integrated circuit is to be calculated automatically, as described with reference to FIGS. 3 and 4. The determination of the second clock is preferably based on an algorithm implemented by a circuit, and preferably by incrementing or decrementing monotonically from the first clock to a target clock, as described with reference to FIGS. 3 and 4. In block 624, the blocks 606 and 612 are repeated. Further repetitions of the blocks 606 and 612 are within the specific contemplation of the present invention, wherein each new clock is determined, until a specific clock or a specific target number of clocks are determined, the target number in an embodiment being input into the die and generated from a tester, and the first clock input into the die and generated from the tester. Therefore, the present invention includes starting on a specific clock (e.g. three clocks after the trigger signal), and stopping on a specific clock (e.g. 300 clocks after the trigger).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An integrated circuit that includes:
    a circuit;
    an at least one scan latch, each scan latch in communication with at least a portion of the circuit to retain a signal state of the portion;
    a memory unit to retain a state of the at least one scan latch; and
    a comparison circuit to compare the state of the retained at least one scan latch in the memory unit to a state of the repective at least one scan latch and to save a result of the comparison, the result including a sequence of at least one bit, each bit representing the result of the comparision between the state of the retained at least one scan latch and the state of the respective at least one scan latch.

2. The integrated circuit defined in claim 1 that further includes a transmission circuit to transmit the result of the comparison to a port.

3. The integrated circuit defined in claim 1 wherein the comparison circuit includes an exclusive-or operation comparison circuit to execute an exclusive- or comparison between the retained at least one scan latch in the memory unit and the state of the at least one scan latch to generate the sequence.

4. The integrated circuit defined in claim 1 that further includes a strobe circuit to strobe circuit to strobe the result of the comparison as a strobed signal.

5. The integrated circuit defined in claim 1 that further includes a clock circuit to clock the scan latch to retain a signal state at a specified clock, to clock the memory unit to retain the state, and to clock the comparison circuit to compare the memory unit state with the scan latch retained signal state.

6. The integrated circuit defined in claim 1 that further includes a first circuit to automatically define a time of a clock pulse to latch the scan latch.

7. The integrated circuit defined in claim 6 wherein the first circuit is to algorithmically define the time of the clock pulse.

8. An integrated circuit that includes:
   an at least one scan latch;
   a signature generator circuit to generate and to retain a signature of a content of the at least one scan latch;
   a memory unit to retain a signature generated by the signature generator circuit; and
   a comparison circuit to compare a signature retained in the memory unit with a signature retained in the signature generator circuit, the comparison circuit to generate a sequence of at least one bit, each bit representing the result of the comparison between each bit of the signature retained in the memory unit and a respective each bit of the signature retained in the signature generator circuit.

9. The integrated circuit defined in claim 8 that further includes a transmission circuit to transmit the result of the comparison to a port.

10. The integrated circuit defined in claim 8 wherein the comparison circuit includes an exclusive-or operation circuit to perform an exclusive-or operation between each bit of the signature retained in the memory unit and the respective each bit of the signature retained in the signature generator circuit.

11. The integrated circuit defined in claim 8 that further includes a strobe circuit to strobe the result of the comparison as a strobed signal.

12. The integrated circuit defined in claim 8 that further includes a clock circuit to clock the at least one scan latch to retain a first signal state at a first clock, to clock the signature generator circuit to generate a first signature of the first signal state, to clock the memory unit to retain the first signature, to clock the scan latch to retain a signal state at a second clock subsequent to the first, and to clock the comparison circuit to compare the memory unit state with the scan latch retained signal state retained at the second clock.

13. The integrated circuit defined in claim 8 that further includes a first circuit to automatically define a clock to latch the scan latch at a specific time.

14. The integrated circuit defined in claim 13 wherein the first circuit automatically defines the clock based on an algorithm.

15. An integrated circuit that includes:
   a circuit;
   an at least one scan latch, each scan latch in communication with at least a portion of the circuit to retain a signal state of the portion; and
   a first circuit to generate a scan latch signal clock to latch each scan latch to retain a signal state at a selected clock during a first sequence of core clock pulses, and to generate the scan latch signal clock to latch the scan latch to retain a signal state at an automatically selected clock during an at least one other sequence of core clock pulses subsequent to the first sequence of core clock pulses.

16. The integrated circuit defined in claim 15 wherein the first circuit generates the scan latch signal clock to retain the signal state at the automatically selected clock based on an algorithm.

17. The integrated circuit defined in claim 15 wherein the first circuit generates the scan latch signal clock to retain the signal state at the automatically selected clock by one of increasing the scan latch signal clock by one core clock for each sequence of core clock pulses and decreasing the scan latch signal lock by one core clock for each sequence of core clock pulses.

18. The integrated circuit defined in claim 15 that further includes a transmission circuit to transmit each of the retained signal state to a port.

19. The integrated circuit defined in claim 15 that further includes
   a memory unit to retain a state of the at least one scan latch at or after a scan clock pulse during a first identified sequence of clock pulses; and
   a comparison circuit to compare the state of the retained at least one scan latch in the memory unit to a state of the at least one scan latch and to save a result of the comparison.

20. The integrated circuit defined in claim 19 that further includes a clock circuit to clock the memory unit to retain the state, and to clock the comparison circuit to compare the memory unit state with the scan latch retained signal state for a sequence of clock pulses subsequent to the first identified sequence of clock pulses.

21. The integrated circuit defined in claim 19 that further includes a transmission circuit to transmit the result of the comparison to a port.

22. The integrated circuit defined in claim 15 that further includes
   a signature generator circuit to generate and to retain a first signature of a content of the at least one scan latch at or after a scan clock pulse during a first identified sequence of clock pulses;
   a memory unit to retain the first signature; and
   a comparison circuit to compare the first signature retained in the memory unit with a second signature retained in the signature generator circuit.

23. The integrated circuit defined in claim 22 that further includes a transmission circuit to transmit the result of the comparison to a port.

24. The integrated circuit defined in claim 22 that further includes a clock circuit to clock the signature generator circuit to generate the first signature of the first signal state for a scan latch pulse during a first sequence of core clock pulses, to clock the memory unit to retain the first signature, to clock the signature generator circuit to generate and retain a second signature for a scan latch pulse during a sequence of core pulses subsequent to the first sequence, and to clock the comparison circuit.

25. A method comprising:
   functionally exercising an integrated circuit that is coupled to at least one capturing circuit storage elements;
   capturing at a first determined clock an at least one first state of the circuit in the storage elements during the exercising; and one of
   transforming the captured first states into a first digital signature, storing the signature in a memory unit, functionally exercising the integrated circuit that is coupled to the storage elements, capturing at a second determined clock an at least one second state of the circuit in the storage elements, transforming the captured second states into a second digital signature, and comparing the first signature stored in the memory unit to the second digital signature; and storing the states in a memory unit, functionally exercising the integrated circuit that is coupled to the storage elements, capturing at a second determined clock an at least one second state of the circuit in the storage elements; and for each storage element, comparing the state in the memory unit with the state in the capture circuit.

26. The method defined in claim 25 further including providing a result of the comparing to a terminal.

27. The method defined in claim 25 wherein the comparing includes performing an exclusive-or operation.

28. The method defined in claim 25 further including automatically changing the second determined clock based on an algorithm at a time after capturing said second state, wherein a second iteration of the method defined in claim 25 includes as the second determined clock the automatically changed clock.

29. A method including functionally exercising an integrated circuit disposed on a die that is coupled to at least one storage elements disposed on the die;

capturing at a first determined clock an at least one first state of the circuit in the storage elements during the exercising;

automatically calculating on the die a second determined clock based on the first determined clock; and repeating the exercising and the capturing using as the value of the first determined clock the automatically calculated second clock.

30. The method defined in claim 29 further including before the repeating the following:

transforming the captured first states into a first digital signature;

storing the signature in a memory unit;

functionally exercising the integrated circuit that is coupled to the storage elements;

capturing at a determined clock an at least one second state of the circuit in the storage elements;

transforming the captured second states into a second digital signature; and comparing each bit of the first signature stored in memory unit to a respective bit of the second digital signature.

* * * * *

UNITED STATES PATENT AND TRADEMARK OFFICE
CERTIFICATE OF CORRECTION

PATENT NO. : 6,883,127 B2
DATED : April 19, 2005
INVENTOR(S) : Slawecki et al.

It is certified that error appears in the above-identified patent and that said Letters Patent is hereby corrected as shown below:

Column 12,
Line 13, delete "lock" and insert -- clock --.

Signed and Sealed this

Fifth Day of July, 2005

JON W. DUDAS
*Director of the United States Patent and Trademark Office*